United States Patent
Clark

(10) Patent No.: US 8,313,994 B2
(45) Date of Patent: Nov. 20, 2012

(54) METHOD FOR FORMING A HIGH-K GATE STACK WITH REDUCED EFFECTIVE OXIDE THICKNESS

(75) Inventor: Robert D Clark, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 198 days.

(21) Appl. No.: 12/719,690

(22) Filed: Mar. 8, 2010

(65) Prior Publication Data

US 2010/0248464 A1   Sep. 30, 2010

(51) Int. Cl.
 *H01L 21/8238* (2006.01)
(52) U.S. Cl. ............... 438/216; 438/778; 257/E21.489
(58) Field of Classification Search .......... 438/216, 438/592, 785, 778; 257/E21.489
 See application file for complete search history.

(56) References Cited

U.S. PATENT DOCUMENTS

| | | | |
|---|---|---|---|
| 4,646,424 A | 3/1987 | Parks et al. | |
| 2002/0142624 A1 | 10/2002 | Levy et al. | |
| 2005/0124175 A1 | 6/2005 | Ahn et al. | |
| 2008/0119057 A1 | 5/2008 | Chua et al. | |
| 2008/0142910 A1* | 6/2008 | Oh ............................... | 257/411 |
| 2008/1500009 | 6/2008 | Chen | |
| 2009/0011608 A1* | 1/2009 | Nabatame ..................... | 438/761 |

OTHER PUBLICATIONS

IC Knowledge, 2002. [Retrieved on May 6, 2006] Retrieved from the Internet: <URL: http://icknowledge.com/misc_technology/Highkgates.pdf> pp. 1-3, sections 2.0, 3.0.
United States Patent and Trademark Office, International Search Report and Written Opinion in corresponding PCT Application No. PCT/US2010/028597, dated Jun. 2, 2010, 8 pages.

* cited by examiner

*Primary Examiner* — Thanhha Pham

(57) ABSTRACT

A method is provided for forming a high-k gate stack with a reduced effective oxide thickness (EOT) for a semiconductor device. The method includes providing a silicon-containing substrate, forming an interface layer on the silicon-containing substrate, where the interface layer has a first equivalent oxide thickness, depositing a first high-k film on the interface layer, and heat-treating the first high-k film and the interface layer at a temperature that forms a modified interface layer, where the modified interface layer has a second equivalent oxide thickness that is equal to or lower than the first equivalent oxide thickness. The method further includes depositing a second high-k film on the modified interface layer. According to one embodiment, the first high-k film includes lanthanum oxide and the second high-k film includes hafnium silicate.

20 Claims, 9 Drawing Sheets

METHOD FOR FORMING A HIGH-K GATE STACK WITH REDUCED EFFECTIVE OXIDE THICKNESS

FIELD OF INVENTION

The present invention relates to the field of integrating high dielectric constant (high-k) films into semiconductor manufacturing, and more particularly to methods for reducing effective oxide thickness (EOT) in high-k gate dielectric stacks.

BACKGROUND OF THE INVENTION

Recent advances in microelectronics have included the use of high-k films in gate dielectric stacks for logic applications. To increase device reliability and reduce electron leakage from the gate electrode to the transistor channel, semiconductor transistor technology is introducing high dielectric constant (high-k) materials that allow increased physical thickness of the gate dielectric layer. Dielectric materials featuring a dielectric constant greater than that of $SiO_2$ (k~3.9) are commonly referred to as high-k materials. An early motivation for seeking high-k films for use in metal-oxide field effect transistors (MOSFETs) was one of simply reducing the leakage current without reducing the film capacitance. Furthermore, for many applications, the high-k films need to have the electrical equivalent of a $SiO_2$ layer having a physical thickness, $T_{ox}$, of about 1 nm.

The presence of a thin dielectric interface layer between a high-k film and an underlying substrate may be highly beneficial to preserve interface state characteristics and form an interface with good electrical properties. The quality of the interface layer can affect device performance, as the interface layer is intimately connected to the channel of the transistor. However, the presence of an interface layer lowers the overall dielectric constant of the gate stack and, therefore, the interface layer may need to be thin.

Many high-k films can catalytically promote growth of a thick interfacial $SiO_2$ layer between the high-k film and a Si substrate during deposition of the high-k film and/or during post-deposition annealing, thereby increasing $T_{ox}$ to unacceptable levels. When a capacitance corresponding to a total $SiO_2$ thickness of about one nm is needed for the replacement of $SiO_2$ gate dielectric in MOSFETs with a high-k film, such low-k reaction layers in series with the desired high-k film, can rapidly nullify the benefits of the high-k film.

Accordingly, further developments are required to solve these and other problems associated with integration of high-k films into semiconductor devices.

SUMMARY OF THE INVENTION

A method is provided for forming a high-k gate stack with a reduced effective oxide thickness (EOT).

According to an embodiment of the invention, a method is provided for forming a gate dielectric stack for semiconductor device. The method includes providing a silicon-containing substrate, and forming an interface layer on the silicon-containing substrate, where the interface layer has a first equivalent oxide thickness. The method further includes depositing a first high-k film on the interface layer, and heat-treating the first high-k film and the interface layer at a temperature that forms a modified interface layer having a second equivalent oxide thickness that is equal to or lower than the first equivalent oxide thickness. The method still further includes depositing a second high-k film on the modified interface layer.

According to an embodiment of the invention, a method is provided for forming a gate dielectric stack for a semiconductor device. The method includes providing a silicon-containing substrate, forming a silicon oxide interface layer on the silicon-containing substrate, where the silicon oxide interface layer has a first equivalent oxide thickness. The method further includes depositing a rare earth-based first high-k film on the silicon oxide interface layer, and heat-treating the rare earth-based first high-k film and the interface layer at a temperature that forms a modified interface layer having a second equivalent oxide thickness that is equal to or lower than the first equivalent oxide thickness. The method still further includes depositing a hafnium-oxygen-based high-k film on the modified interface layer and optionally nitriding at least a portion of a thickness of the hafnium-oxygen-based high-k film.

According to another embodiment of the invention, the method includes providing a silicon-containing substrate, forming a silicon oxide interface layer on the silicon-containing substrate, where the silicon oxide interface layer has a first equivalent oxide thickness. The method further includes depositing a lanthanum oxide first high-k film on the silicon oxide interface layer, heat-treating the lanthanum oxide first high-k film and the silicon oxide interface layer at a temperature that forms a modified interface layer having a second equivalent oxide thickness that is equal to or lower than the first equivalent oxide thickness. The method still further includes depositing a second high-k film on the modified interface layer and optionally nitriding at least a portion of a thickness of the second high-k film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
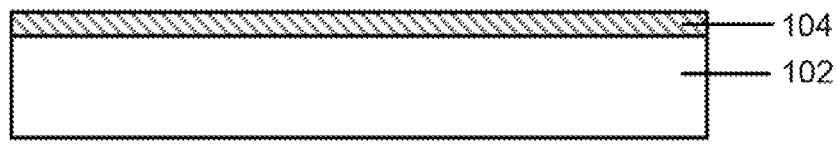
FIGS. 1A-1I schematically show cross-sectional views of forming a high-k gate stack with reduced EOT according to an embodiment of the invention.

Methods for forming high-k gate stacks with low EOTs for semiconductor manufacturing are disclosed in various embodiments. EOT is a number that is frequently used to compare performance of high-k based MOS devices with the performance of $SiO_2$ based MOS devices, where EOT represents the thickness of a $SiO_2$ gate dielectric film needed to obtain the same gate capacitance as a thicker high-k film.

As described above, many high-k films can catalytically promote growth of a thick interfacial $SiO_2$ layer between a high-k film and a Si substrate during deposition of the high-k film and/or during post-deposition annealing, thereby increasing $T_{ox}$ to unacceptable levels and rapidly nullifying the benefits of the high-k film. The current inventors have realized that proper heat-treating of a rare earth-based first high-k film deposited on an interface layer in a gate stack prior to depositing a second high-k film, unexpectedly provides EOT scaling (EOT decrease) for the high-k gate stack. This results in a high-k stack that is physically thicker but electronically thinner when compared to the same gate stack without the proper heat-treating. The high-k gate stack further provides a shift to lower flat band voltage ($V_{fb}$), as may be desirable for a negative carrier field effect transistor (NFET).

According to an embodiment of the invention, a method is provided for forming a gate dielectric stack for semiconductor device. The method includes providing a silicon-containing substrate, forming an interface layer on the silicon-containing substrate, where the interface layer has a first equivalent oxide thickness, depositing a first high-k film on the interface layer, and heat-treating the first high-k film and the interface layer at a temperature that forms a modified interface layer having a second equivalent oxide thickness that is equal to or lower than the first equivalent oxide thickness. The method further includes depositing a second high-k film on the modified interface layer. According to some embodiments of the invention, the first high-k film, the second high-k film, or both the first and second high-k film, can contain an alkaline earth element, titanium, hafnium, or a rare earth element, or any combination of two or more thereof.

According to an embodiment of the invention, the method includes providing a silicon-containing substrate, forming an interface layer on the silicon-containing substrate, where the interface layer has a first equivalent oxide thickness, depositing a rare earth-based first high-k film on the interface layer, and heat-treating the rare earth-based first high-k film and the interface layer at a temperature to form a modified interface layer having a second equivalent oxide thickness that is equal to or lower than the first equivalent oxide thickness. The method further includes depositing a second high-k film on the modified interface layer and optionally nitriding at least a portion of a thickness of the second high-k film.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention.

Similarly, for purposes of explanation, specific numbers, materials, and configurations are set forth herein in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention.

FIGS. 1A-1I schematically show cross-sectional views of forming a high-k gate stack with reduced EOT according to an embodiment of the invention. FIG. 1A schematically shows a silicon-containing substrate 102 containing an interface layer 104. The substrate 102 can be of any size, for example a 200 mm substrate, a 300 mm substrate, or an even larger substrate. According to one embodiment, the substrate 102 can contain Si, for example crystalline Si, polycrystalline Si, or amorphous Si. In one example, the substrate 102 can be a tensile-strained Si layer. According to another embodiment, the substrate 102 may contain Ge or $Si_xGe_{1-x}$ compounds, where x is the atomic fraction of Si, 1-x is the atomic fraction of Ge, and $0<(1-x)<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 102 can be a compressive-strained Ge layer or a tensile-strained $Si_xGe_{1-x}$ (x>0.5) deposited on a relaxed $Si_{0.5}Ge_{0.5}$ buffer layer.

The interface layer 104 can contain silicon oxide (e.g., $SiO_x$, where x is equal to or less than 2), silicon nitride, silicon oxynitride, or a combination thereof. In one example, the interface layer 104 can contain high mobility, low defect $SiO_2$. The interface layer 104 can have a thickness between about 5 angstrom and about 15 angstrom, between about 6 angstrom and about 10 angstrom, for example about 8 angstrom. The interface layer 104 may be formed on a clean substrate 102. Cleaning of the substrate 102 may be performed in a liquid bath containing dilute hydrofluoric acid (HF) or, alternatively, by HF gas phase etching. The dilute HF liquid solution can be a $H_2O$:HF (e.g., a 50:1) mixture. Following the HF cleaning process, the substrate 102 may be rinsed in de-ionized (D.I.) water. The interface layer 104 may contain a chemical oxide layer formed by oxidizing a surface of a monocrystalline silicon substrate 102 following removal of a native oxide layer. The chemical oxide layer may be formed in an aqueous bath containing deionized (DI) water and ozone ($O_3$), for example. The chemical oxide layer can be of high purity and can have a thickness between about 6 angstrom and about 15 angstrom. The chemical oxide layer passivates the underlying unoxidized portion of the monocrystalline silicon substrate 102 and forms a barrier to native oxide formation upon air exposure. Following formation of the chemical oxide layer, the substrate 102 is removed from the aqueous solution and dried, for example by a combination of isopropyl alcohol application and spin-drying. The presence of the chemical oxide layer on the substrate 102 limits buildup of atmospheric contaminants (e.g., organic contaminants) to the exposed surface of the chemical oxide layer upon transferring the substrate 102 from the aqueous solution to a vacuum processing tool for further processing. According to other embodiments, a clean substrate 102 may be transferred to the vacuum processing tool and the interface layer 104 formed in the vacuum processing tool.

Figure 1B:

FIG. 1B schematically shows a rare earth-based first high-k film 106 deposited on the interface layer 104. The rare earth-based first high-k film 106 can include an oxide, nitride, or oxynitride film containing yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combinations of two or more thereof. Examples of rare earth oxide high-k films include lanthanum oxide ($La_2O_3$), lutetium oxide ($Lu_2O_3$), and lanthanum lutetium oxide ($LaLuO_3$). A thickness of the rare earth-based first high-k film 106 can be, for example, between about 2 angstrom and about 30 angstrom, between about 5 angstrom and about 20 angstrom, or between about 5 angstrom and about 10 angstrom. The rare earth-based first high-k film 106 may be, for example, deposited by chemical vapor deposition (CVD), atomic layer deposition (ALD), plasma-enhanced CVD (PECVD), or plasma-enhanced ALD (PEALD). According to one embodiment of the invention, ALD or PEALD methods may be utilized due to normally superior uniformity and atomic level thickness control compared to CVD and PECVD methods.

According to one embodiment of the invention, first high-k film 106 can contain an alkaline earth element, titanium, hafnium, or a rare earth element, or any combination of two or more thereof. According to some embodiments, the first high-k film 106 may contain an element selected from the Periodic Table of the Elements that is capable of forming a high-k film, for example an oxide film, a nitride film, or an oxynitride film. In one example, the element capable of forming a high-k film may react with the interface layer 104 and form a high-k film.

Figure 1C:
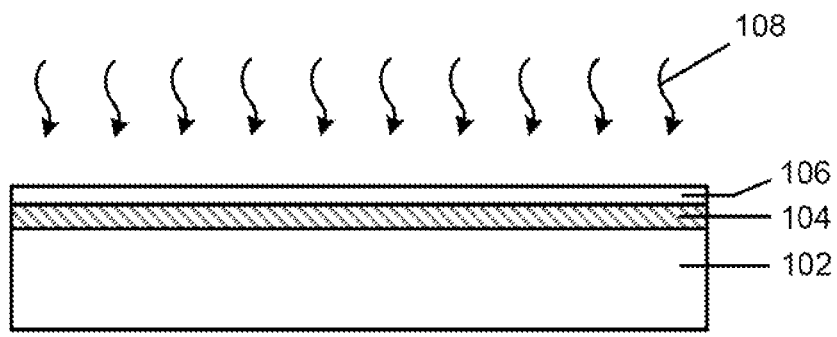
Figure 1D:
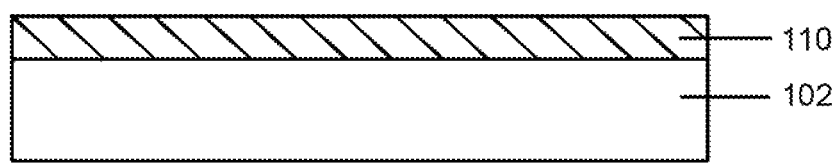

In FIG. 1C, arrows 108 represent heat-treating of the rare earth-based first high-k film 106 and interface layer 104. According to embodiments of the invention, the heat-treating includes heating the rare earth-based first high-k film 106 and the interface layer 104 at a temperature that forms a modified interface layer 110 depicted in FIG. 1D. The modified interface layer 110 has an equivalent oxide thickness that is equal to or lower than the equivalent oxide thickness of the interface layer 104 shown in FIG. 1A. The heat-treating may be performed for a time period between about 10 seconds and 600 seconds, for example about 300 seconds. The heat-treating may be performed under substantially oxygen-free reduced pressure conditions with or without the use of an inert gas. In one example, the heat-treating may be performed in an inert atmosphere at a pressure less than 100 Torr with less than 0.1% $O_2$ gas in the inert atmosphere. In one example, the heat-treating may be performed at a pressure below 1 mTorr, below 0.1 mTorr, or below 0.01 mTorr, in the absence of an inert gas. When an inert gas is used, the inert gas may be selected from $N_2$ gas and the noble gases. Exemplary heat-treating conditions that use an inert gas may include an inert gas pressure in a range from about 1 mTorr to about 100 Torr, or in a range from about 100 m Torr to about 10 Torr. However, embodiments of the invention are not limited by these heat-treating conditions as other heat-treating conditions may be utilized.

In one example, the substrate 102 may contain monocrystalline silicon, the interface layer 104 may contain $SiO_2$, the rare earth-based first high-k film 106 may contain $La_2O_3$, and the heat-treating temperature may be equal to or greater than 900° C. It is to be understood, however, that the heat-treating temperature may be selected such that low EOT is achieved for a particular rare earth-based first high-k film 106 deposited on a particular interface layer.

Figure 1E:
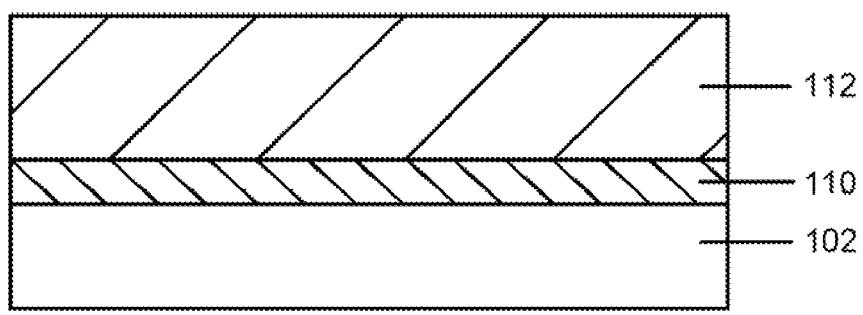

FIG. 1E shows a second high-k film 112 deposited on the modified interface layer 110. The second high-k film 112 can, for example, contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), or hafnium zirconium silicon oxynitride (HfZrSiON), or a combination of two or more thereof. A thickness of the second high-k film 112 can be, for example, between about 10 angstrom and about 100 angstrom, between about 15 angstrom and about 50 angstrom, or between about 20 angstrom and about 40 angstrom. The second high-k film 112 may be, for example, deposited by CVD, ALD, PECVD, or PEALD.

According to one embodiment of the invention, the second high-k film 112 may contain an alkaline earth element, titanium, hafnium, zirconium, or a rare earth element, or any combination of two or more thereof.

Figure 1F:
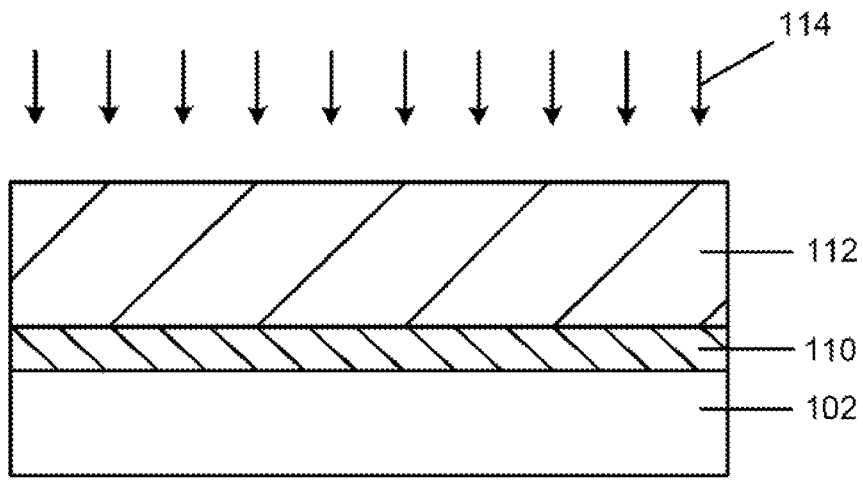
Figure 1G:
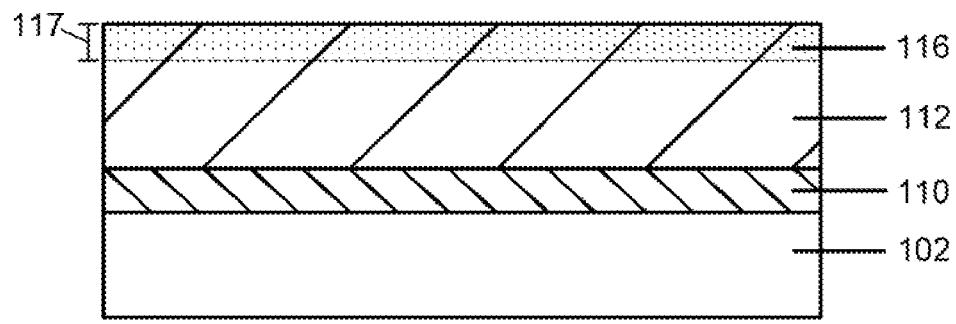

According to some embodiments of the invention, at least a portion of a thickness of second high-k film 112 may be nitrided. Benefits of such nitridation can include improved diffusion barrier properties of the second high-k film 112 and a higher dielectric constant. FIG. 1F shows exposure of the second high-k film 112 to nitriding species 114 that may be formed by thermal excitation and/or plasma excitation of a nitrogen-containing gas. Examples of nitrogen-containing gases include, but are not limited to, nitrogen ($N_2$), ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). In other examples, the nitrogen-containing gas may contain an oxygen- and nitrogen-containing gas, for example, NO, $NO_2$, or $N_2O$, or a combination thereof. FIG. 1G shows a nitrided region 116 having a thickness 117 following an exposure to the second high-k film 112 to nitriding species 114. According to other embodiments, the nitriding step depicted in FIG. 1F may be omitted.

Figure 1H:
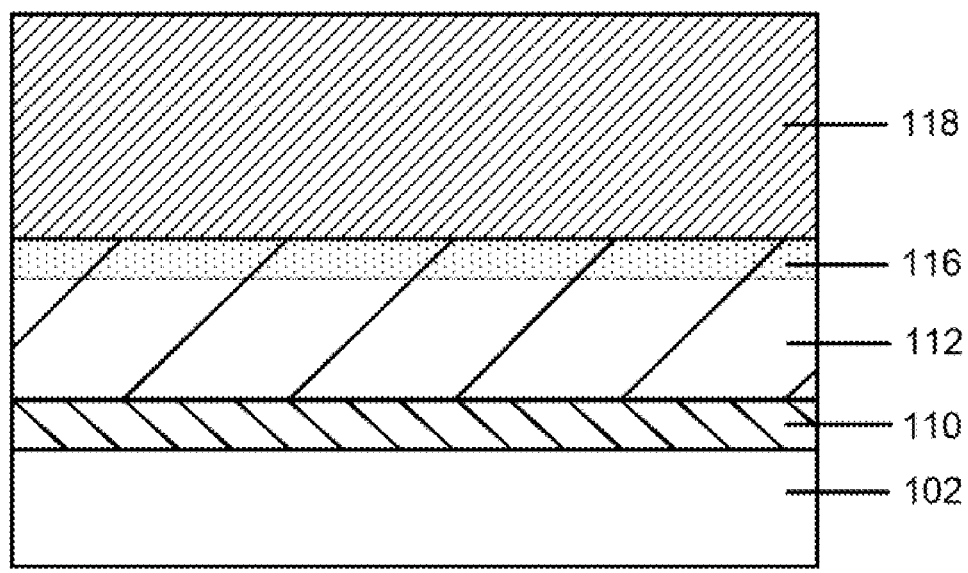

FIG. 1H schematically shows a gate electrode 118 deposited on the second high-k film 112. The gate electrode 118 can have a thickness between about 2 nm and about 40 nm, or between about 3 nm and about 20 nm and can, for example, contain W, WN, WSix, Al, Mo, Ta, TaN, TaSiN, HfN, HfSiN, Ti, TiN, TiSiN, MoN, Re, Pt, or Ru. Although not shown in FIG. 1H, the gate electrode 118 may further be capped with a polysilicon layer, an oxygen diffusion barrier, or both. Representative oxygen diffusion barriers include, but are not limited to amorphous silicon, TiN, TaN, TaSiN, TiSiN and Ru.

Figure 1I:
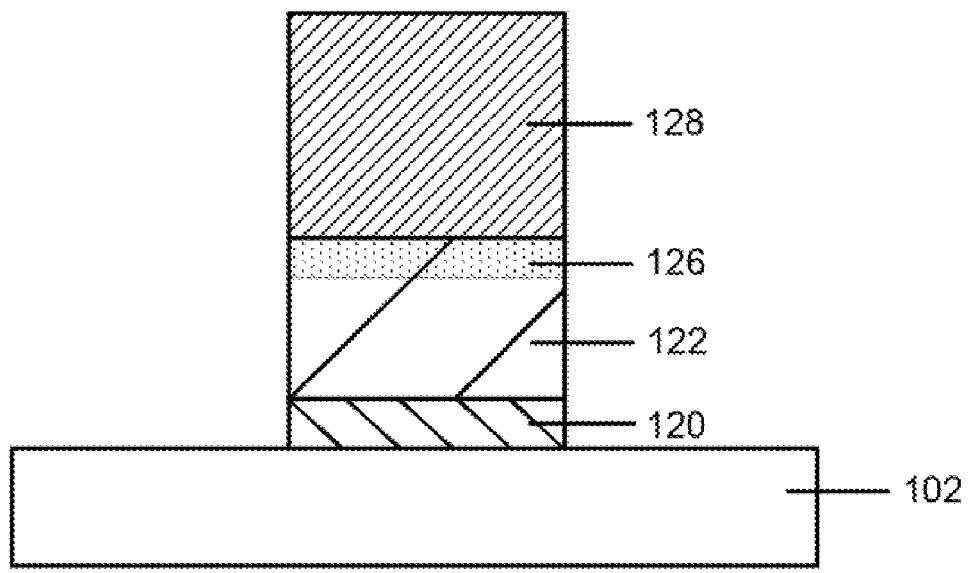

According to an embodiment of the invention, the film structure shown in FIG. 1H may be further processed to form a patterned gate stack using standard lithography and etching methods. For example, a photolithography tool may be used to image a pattern onto a photoresist material (not shown) deposited on the film structure in FIG. 1H. The pattern provides a physical barrier during a subsequent etching process (e.g., a plasma etching process) that selectively removes material not protected by the exposed photoresist. FIG. 1I schematically shows a patterned gate stack containing a patterned modified interface layer 120, patterned second high-k film 122 containing a patterned nitrided region 126, and a patterned gate electrode 128.

Figure 2A:
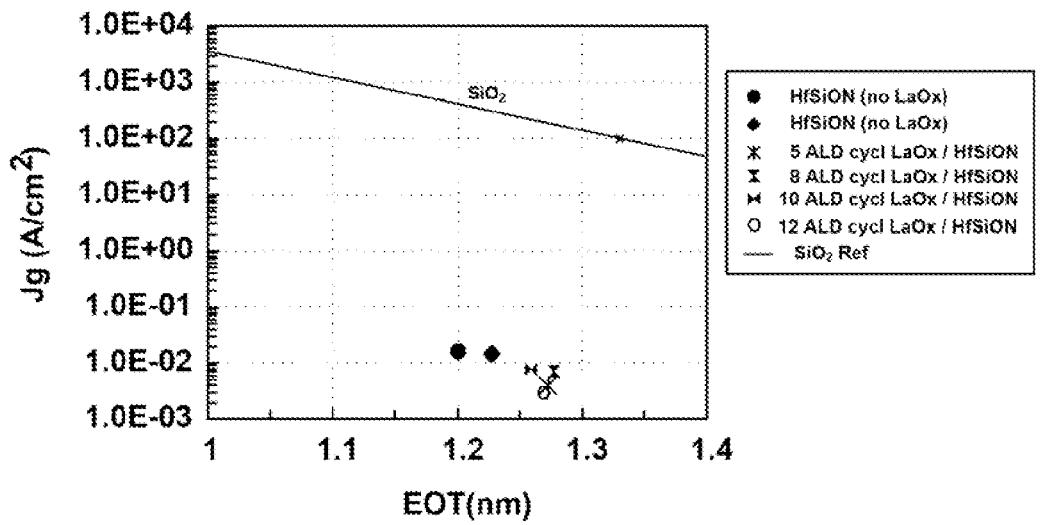
FIG. 2A shows leakage current ($J_g$) as a function of EOT for high-k gate stacks containing HfSiON films and different thicknesses of lanthanum oxide high-k films according to embodiments of the invention.

FIG. 2A shows leakage current ($J_g$) as a function of EOT for high-k gate stacks containing HfSiON films and different thicknesses of lanthanum oxide high-k films according to embodiments of the invention. The gate stacks further contained $SiO_2$ interface layers on the Si substrates and 10 nm thick TiN gate electrode films formed on the HfSiON films. The $SiO_2$ interface layers were chemical oxide layers formed in an aqueous bath containing deionized (DI) water and ozone ($O_3$) and had an estimated thickness of 0.6 nm-1 nm. The lanthanum oxide high-k films were deposited on the $SiO_2$ interface layers by ALD using alternating exposures of diisopropyl formamidinate lanthanum ($La((({}^iPr)_2N)_2CH)_3$) and $O_2$ gas, at a substrate heater temperature of 305° C. and a process pressure between about 0.2 Torr and about 0.6 Torr. The number of ALD cycles was varied from 5-12 and the lanthanum oxide deposition rate was estimated to be approximately 0.8 nm/cycle. The HfSiON films were formed by depositing HfSiO films and subsequently exposing the HfSiO films to a plasma excited-nitriding gas to incorporate nitrogen into the HfSiO films. The HfSiO films were deposited by a chemical vapor deposition (CVD) process using hafnium tert-butoxide ($Hf(O^tBu)_4$), tetra-ethyl orthosilicate ($Si(OCH_2CH_3)_4$), and $O_2$. FIG. 2A shows that the presence of the thin lanthanum oxide high-k films between the $SiO_2$ interface layers and the HfSiON films increased the EOT from about 1.2 nm to about 1.25 nm-1.3 nm and decreased the leakage current. The increases in EOT are expected since the lanthanum oxide high-k films are dielectric films. FIG. 2A further shows $J_g$ as a function of EOT for a conventional $SiO_2$ gate dielectric film.

Figure 2B:
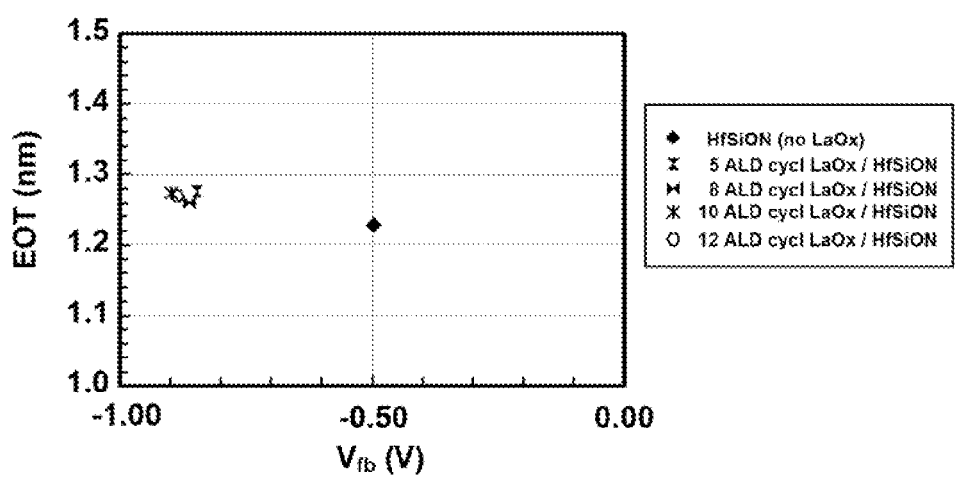
FIG. 2B shows EOT as a function of flat band voltage ($V_{fb}$) for high-k gate stacks containing HfSiON films and different thicknesses of lanthanum oxide high-k films according to embodiments of the invention.

FIG. 2B shows EOT as a function of flatband voltage ($V_{fb}$) for high-k gate stacks containing HfSiON films and different thicknesses of underlying lanthanum oxide high-k films according to embodiments of the invention. The $V_{fb}$ decreased from −0.5V to between about −0.8V and about −0.9V.

Figure 3A:
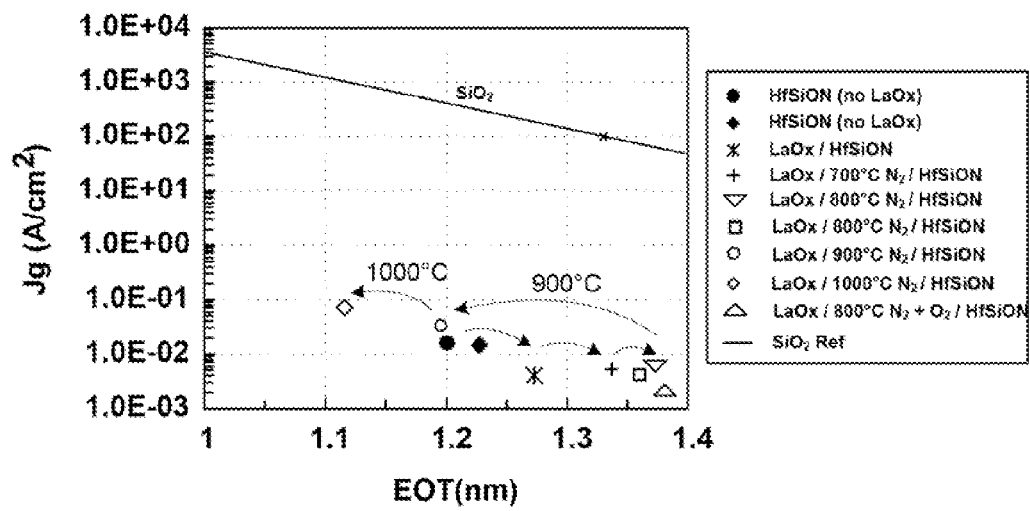
FIG. 3A shows $J_g$ as a function of EOT for high-k gate stacks containing HfSiON films and lanthanum oxide high-k films heat-treated at different temperatures prior to deposition of the HfSiON films according to embodiments of the invention.

FIG. 3A shows $J_g$ as a function of EOT for high-k gate stacks containing HfSiON films and lanthanum oxide high-k films heat-treated at different temperatures prior to deposition of the HfSiON films according to embodiments of the invention. FIG. 3A is similar to FIG. 2A but the lanthanum oxide high-k films were deposited using 10 ALD cycles and subsequently heat-treated in $N_2$ gas at a gas pressure of 1.5 Torr and at temperatures of 700° C., 800° C., 900° C., or 1000° C. The heat-treating formed modified interface layers by interaction/reaction of the $SiO_2$ interface layers with the lanthanum oxide high-k films. Following the heat-treating, the HfSiON films were deposited on the modified interface layers and the TiN films deposited on the HfSiON films. FIG. 3A shows that heat-treating the lanthanum oxide high-k films at 700° C. or 800° C. increased the EOT of the high-k gate stacks, possibly due to an increase of the $SiO_2$ interface layer from further oxidation of the silicon substrate.

FIG. 3A further shows that the EOT of the high-k gate stacks containing the modified interface layers unexpectedly decreased when the lanthanum oxide high-k films and interface layers were heat-treated at 900° C. or 1000° C. In particular, heat-treating at 900° C. reduced the EOTs to values approximately equal to or less than the values obtained without the use of a lanthanum oxide high-k film in the high-k gate stacks. Heat-treating at 1000° C. further reduced the EOT to a value of about 1.1 nm, which is ~0.1 nm lower than the value obtained without the use of a lanthanum oxide high-k film or when using a lanthanum oxide high-k film heat-treated at 900° C. It is speculated that the unexpected lowering of the EOT may be due to reaction of the lanthanum oxide high-k films with the $SiO_2$ interface layers and/or due to vacuum evaporation of at least a portion of the $SiO_2$ interface layers. For comparison, high-k gate stacks containing lanthanum oxide high-k films that were heat-treated at 900° C. or 1000° C. only after HfSiON deposition on $SiO_2$ interface layers, did not result in such EOT scaling.

Figure 3B:
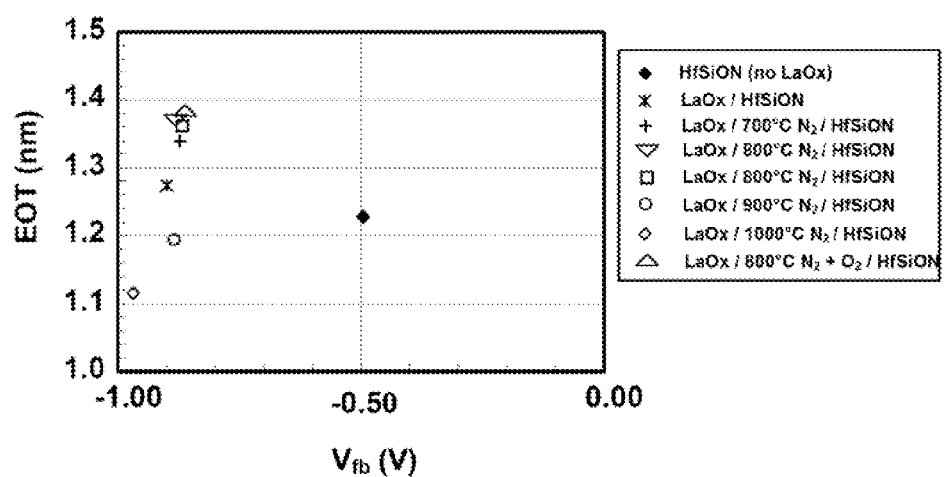
FIG. 3B shows EOT as a function of $V_{fb}$ for high-k gate stacks containing HfSiON films and lanthanum oxide high-k films heat-treated at different temperatures prior to deposition of the HfSiON films according to embodiments of the invention.

FIG. 3B shows EOT as a function of $V_{fb}$ for high-k gate stacks containing HfSiON films and lanthanum oxide high-k films heat-treated at different temperatures prior to deposition of the HfSiON films according to embodiments of the invention. FIG. 3B is similar to FIG. 2B but the lanthanum oxide high-k films were deposited used 10 ALD cycles and subsequently heat-treated at temperatures of 700° C., 800° C., 900° C., or 1000° C., before depositing the HfSiON films and the TiN films. The $V_{fb}$ decreased from −0.5V to between about −0.8V and about −1V.

Figure 4:
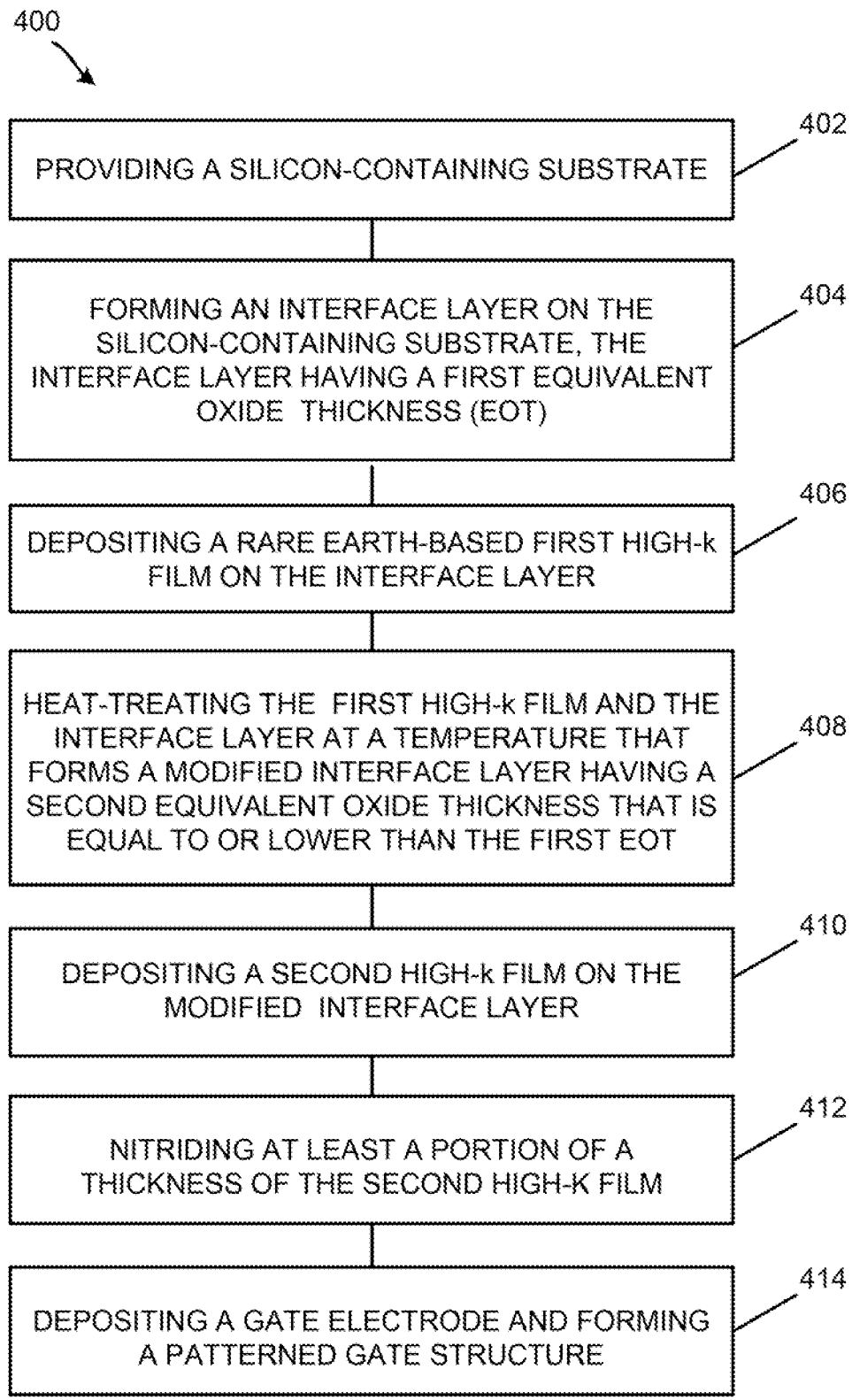
FIG. 4 is a process flow diagram for forming a high-k gate stack with reduced EOT according to an embodiment of the invention.

FIG. 4 is a process flow diagram for forming a high-k gate stack with reduced EOT according to an embodiment of the invention. The processing steps have been described in detail above. The process 400 begins at 402, when a silicon-containing substrate is provided. According to some embodiments, the substrate may contain Si, for example crystalline Si, polycrystalline Si, or amorphous Si. According to another embodiment, the substrate may contain Ge or $Si_xGe_{1-x}$ compounds, where x is the atomic fraction of Si, 1-x is the atomic fraction of Ge, and 0<(1-x)<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$.

At 404, an interface layer is formed on the silicon-containing substrate. According to some embodiments, the interface layer can contain silicon oxide, silicon nitride, or silicon oxynitride.

At 406, a first high-k film is deposited on the interface layer. The first high-k film can include an oxide, nitride, or oxynitride containing yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combination of two or more thereof. Examples of rare earth-based high-k films include lanthanum oxide ($La_2O_3$), lutetium oxide ($Lu_2O_3$), and lanthanum lutetium oxide ($LaLuO_3$).

At 408, the first high-k film and the interface layer are heat-treated at a temperature that forms a modified interface layer having a second EOT that is equal to or lower than the first EOT of the interface layer. According to some embodiments, the heat-treating includes heating the first high-k film and the interface layer at the temperature under substantially oxygen-free reduced pressure conditions. The heat-treating may further include exposing the first high-k film to an inert gas.

At 410, a second high-k film is deposited on the modified interface layer. According to some embodiments of the invention, the second high-k film can include hafnium oxide, hafnium oxynitride, hafnium silicate, hafnium silicon oxynitride, zirconium oxide, zirconium oxynitride, zirconium silicate, zirconium silicon oxynitride, hafnium zirconium oxide, hafnium zirconium oxynitride, hafnium zirconium silicate, or hafnium zirconium silicon oxynitride, or a combination of two or more thereof.

At 412, at least a portion of a thickness of the second high-k film is optionally nitrided. In one example, the nitrided second high-k film may be further heat-treated. The heat-treating conditions can include a temperature of 900-1000° C., and an $N_2$ gas environment of approximately 1.5 Torr that optionally contains a small amount of $O_2$ (e.g., about 0.1% $O_2$). At 414, a gate electrode is deposited on the second high-k film or nitrided second high-k film and a patterned gate structure is formed by patterning the gate electrode film, the nitrided second high-k film, and the modified interface layer.

Figure 5:
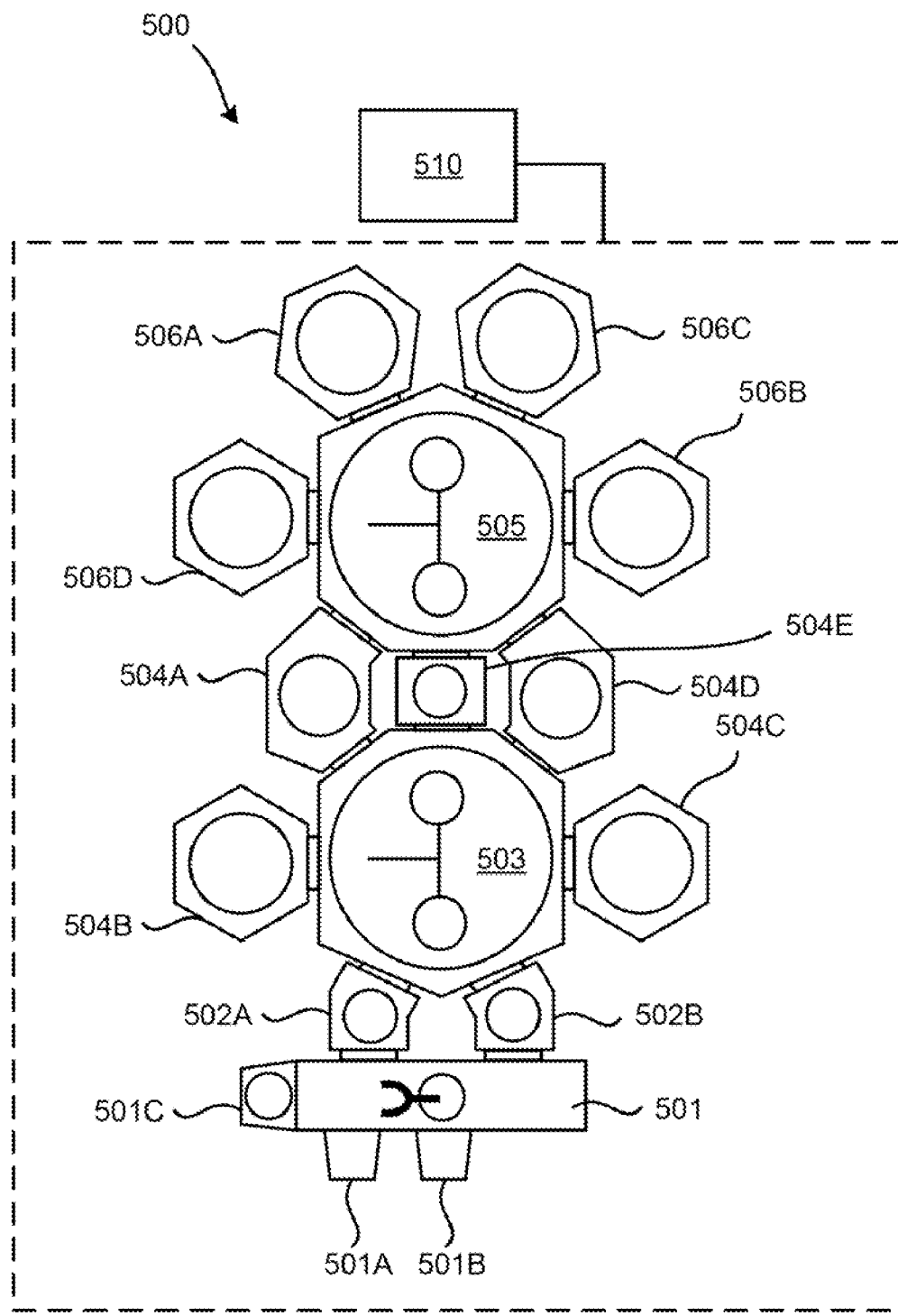
FIG. 5 is a schematic diagram of a vacuum processing tool for forming a high-k gate stack with reduced EOT according to embodiments of the invention.

FIG. 5 is a schematic diagram of a vacuum processing tool for forming a high-k gate stack with reduced EOT according to an embodiment of the invention. The vacuum processing tool 500 contains a substrate (wafer) transfer system 501 that includes cassette modules 501A and 501B, and a substrate alignment module 501C. Load-lock chambers 502A and 502B are coupled to the substrate transfer system 501. The substrate transfer system 501 is maintained at atmospheric pressure but a clean environment is provided by purging with an inert gas.

The load lock chambers 502A and 502B are coupled to a substrate transfer system 503. The substrate transfer system 503 may be maintained at a very low base pressure (e.g., $5 \times 100^{-8}$ Torr, or lower), using a turbomolecular pump (not shown). The substrate transfer system 503 includes a substrate transfer robot and is coupled to degassing systems 504A and 504D, and processing systems 504B and 504C may be configured for forming an interface layer on a substrate.

Furthermore, the substrate transfer system 503 is coupled to a substrate transfer system 505 through substrate handling chamber 504E. As in the substrate transfer system 503, the substrate transfer system 505 may be maintained at a very low base pressure (e.g., $5 \times 10^{-8}$ Torr, or lower), using a turbomolecular pump (not shown). The substrate transfer system 505 includes a substrate transfer robot. Coupled to the substrate transfer system 505 are processing systems 506D configured for depositing a rare earth-based first high-k film on the substrate, processing system 506A configured for depositing a second high-k film on the substrate, processing system 506C configured for optionally nitriding a film, and processing system 506B for depositing a gate electrode film on the substrate.

Figure 6A:
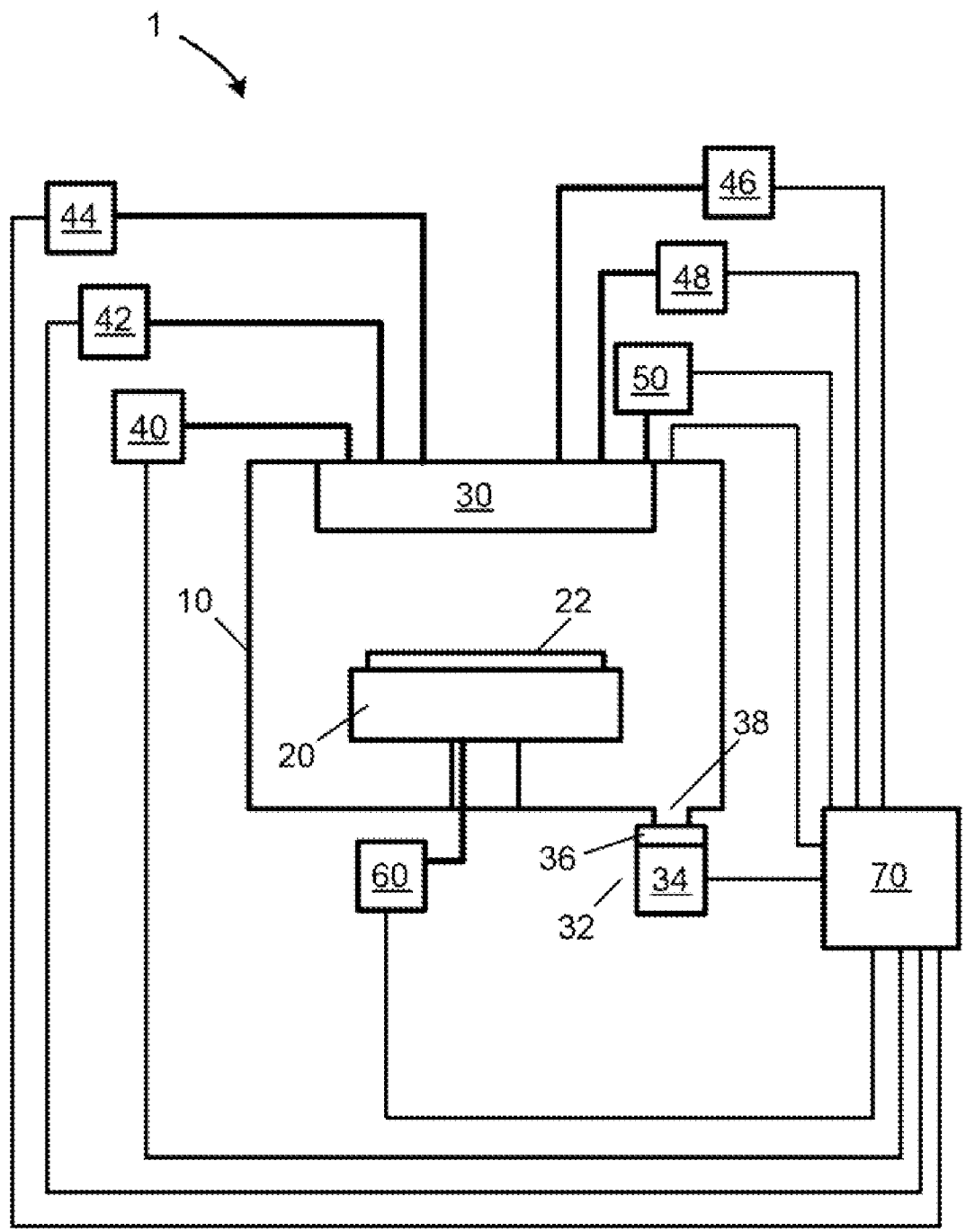
FIGS. 6A and 6B illustrate processing systems for depositing high-k materials on a substrate according to embodiments of the invention.
Figure 6B:
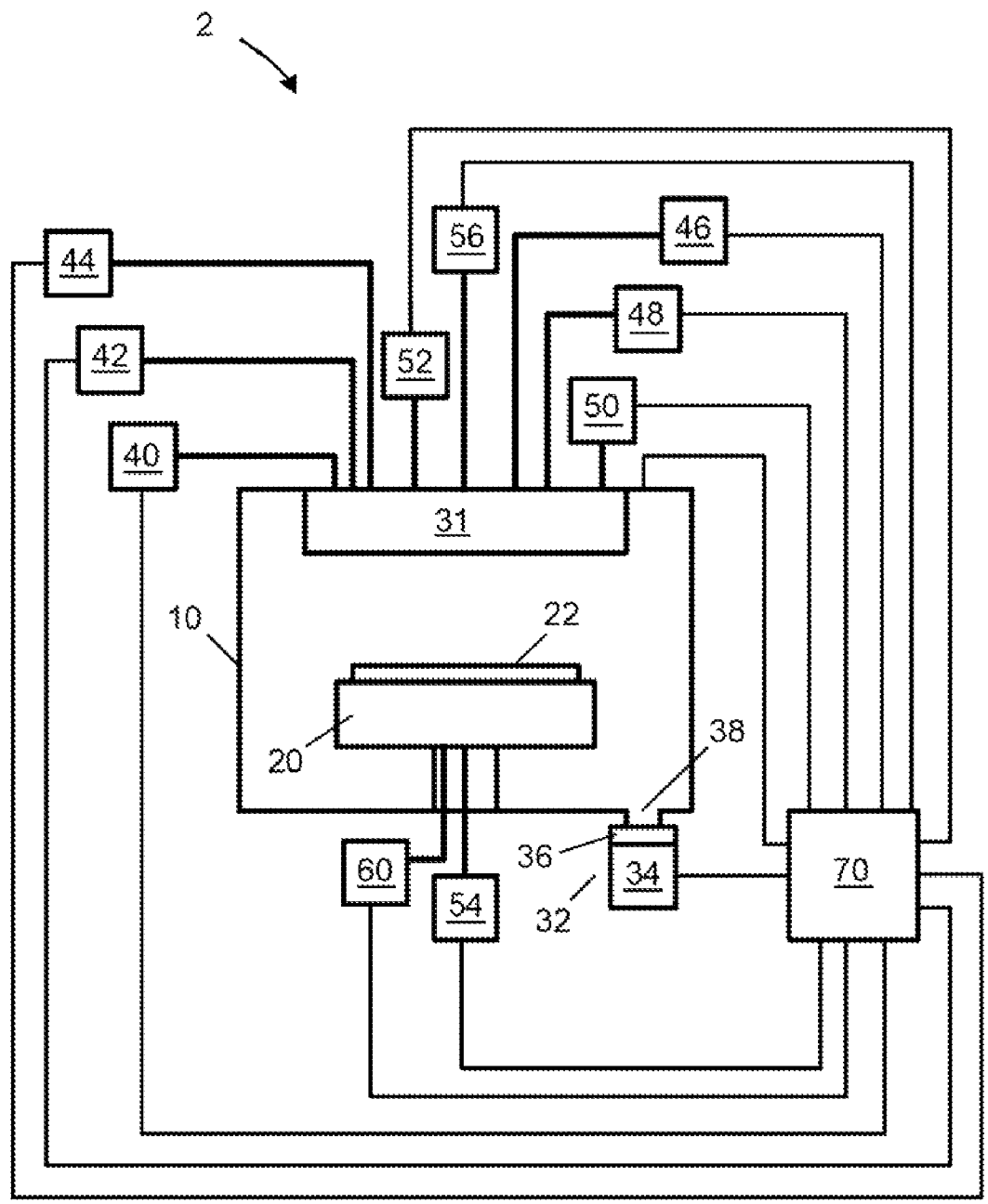

For example, either processing systems 1 and 2 shown in FIGS. 6A and 6B may be utilized as processing systems 506A and 506D in the vacuum processing tool 500. Processing system 506C can, for example, include a plasma processing system containing a slot plane antenna (SPA) plasma source from Tokyo Electron Limited, Akasaka, Japan. Further details of a plasma processing system containing a slot plane antenna plasma source and methods of using are described in European Patent No. EP1361605, titled "METHOD FOR PRODUCING MATERIAL OF ELECTRONIC DEVICE", the entire contents of which is hereby incorporated by reference. Alternately, processing system 506C may, for example, include a ultra-violet (UV) radiation plasma source and a remote plasma source. Such a processing system is described in European Patent No. EP1453083A1, titled "NITRIDING METHOD FOR INSULATION FILM, SEMICONDUCTOR DEVICE AND PRODUCTION METHOD FOR SEMICONDUCTOR DEVICE, SUBSTRATE TREATING DEVICE AND SUBSTRATE TREATING METHOD", the entire contents of which is hereby incorporated by reference. According to one embodiment, processing systems 504B and 504C may include a ultra-violet (UV) radiation plasma source and a remote plasma source as describe above and configured for forming an interface layer on a substrate or nitriding a film.

The vacuum processing tool 500 includes a controller 510 that can be coupled to and control any or all of the processing systems and processing elements depicted in FIG. 5 during the integrated substrate processing. Alternatively, or in addition, controller 510 can be coupled to one or more additional controllers/computers (not shown), and controller 510 can obtain setup and/or configuration information from an additional controller/computer. The controller 510 can be used to configure any or all of the processing systems and processing elements, and the controller 510 can collect, provide, process, store, and display data from any or all of the processing systems and processing elements. The controller 510 can comprise a number of applications for controlling any or all of the processing systems and processing elements. For example, controller 510 can include a graphic user interface (GUI) component (not shown) that can provide easy to use interfaces that enable a user to monitor and/or control one or more processing systems and processing elements.

The controller 510 can include a microprocessor, memory, and a digital I/O port capable of generating control voltages sufficient to communicate, activate inputs, and exchange information with the vacuum processing tool 500 as well as monitor outputs from the vacuum processing tool 500. For example, a program stored in the memory may be utilized to activate the inputs of the vacuum processing tool 500 according to a process recipe in order to perform integrated substrate processing. The controller 510 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 510 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 510, for driving a device or devices for implementing the invention, and/or for enabling the controller 510 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 510 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 510.

The controller 510 may be locally located relative to the vacuum processing tool 500, or it may be remotely located relative to the vacuum processing tool 500. For example, the controller 510 may exchange data with the vacuum processing tool 500 using at least one of a direct connection, an intranet, the Internet and a wireless connection. The controller 510 may be coupled to an intranet at, for example, a customer site (i.e., a device maker, etc.), or it may be coupled to an intranet at, for example, a vendor site (i.e., an equipment manufacturer). Additionally, for example, the controller 510 may be coupled to the Internet. Furthermore, another computer (i.e., controller, server, etc.) may access, for example, the controller 510 to exchange data via at least one of a direct connection, an intranet, and the Internet. As also would be appreciated by those skilled in the art, the controller 510 may exchange data with the vacuum processing tool 500 via a wireless connection.

As those skilled in the art will readily recognize, embodiments of the invention may not require the use of all the processing systems of the vacuum processing tool 500 depicted in FIG. 5. As described above, the vacuum processing tool 500 may contain two processing system (e.g., processing systems 504B and 504C) configured for performing the same or similar processing. This may be done in order to increase wafer throughput of the vacuum processing tool 500. Thus, some embodiments of the invention may include the use of less than all the processing systems depicted in FIG. 5.

FIGS. 6A and 6B illustrate processing systems for depositing high-k materials on a substrate according to embodiments of the invention. The processing systems shown in FIGS. 6A and 6B may be utilized as processing system 506D for depositing a rare earth-based first high-k film on a substrate and as processing system 506A for depositing a second high-k film on a substrate.

FIG. 6A illustrates a processing system 1 that may be configured for performing ALD or CVD processing. The processing system 1 includes a process chamber 10 having a substrate holder 20 configured to support a substrate 22, upon which high-k material is deposited. The process chamber 10 further contains an upper assembly 30 (e.g., a showerhead) coupled to a first precursor supply system 40 and a second precursor supply system 42. The first and second precursor supply systems 40,42 may include rare earth precursor supply systems, a hafnium precursor supply system, a zirconium precursor supply system, a titanium precursor supply system, or alkali earth precursor supply systems, or a combination thereof.

The processing system 1 further includes a purge gas supply system 44, an oxygen-containing gas supply system 46, a nitrogen-containing gas supply system 48, and an auxiliary gas supply system 50. The auxiliary gas supply system may, for example, be used for supplying additional rare earth precursor or a silicon precursor. Additionally, processing system 1 includes a substrate temperature control system 60 coupled to substrate holder 20 and configured to elevate and control the temperature of substrate 22. Furthermore, the processing system 1 includes a controller 70 that can be coupled to process chamber 10, substrate holder 20, upper assembly 30 configured for introducing process gases into the process chamber 10, first precursor supply system 40, second precursor supply system 42, purge gas supply system 44, oxygen-containing gas supply system 46, nitrogen-containing gas supply system 48, auxiliary gas supply system 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 6A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements. The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 6A, the processing system 1 may be configured to process 200 mm substrates, 300 mm substrates, or larger-sized substrates. In fact, it is contemplated that the processing system 1 may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the high-k materials described in the embodiments of the invention.

According to embodiments of the invention, several methods may be utilized for introducing the first and/or second precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired stoichiometry can be attained within the deposited film. Another method of delivering the first and second precursors includes separately controlling two or more different liquid sources (neat precursors or precursor solutions), which are then mixed prior to entering a common vaporizer. This method may be utilized when the precursors are compatible in solution or in liquid form and they have similar vaporization characteristics. Yet another method of delivering the first and second precursor includes controlling the flow of a liquid precursor mixture (neat precursors or precursors solutions) to a common vaporizer. Other methods include the use of compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases, it may be possible to dissolve one or more compatible solid precursors in one or more compatible liquid precursors. It will be apparent to one skilled in the art that by controlling the relative concentration levels of the first and second precursors within a gas pulse, it is possible to deposit films with desired stoichiometries.

Embodiments of the invention may utilize a wide variety of hafnium and zirconium precursors. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors.

Embodiments of the inventions may utilize a wide variety of different rare earth precursors. For example, many rare earth precursors have the formula:

$$ML^1L^2L^3D_x$$

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyrroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide, di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrrolidine, triethylamine, trimethylamine, acetonitrile, and 2,2-dimethylpropionitrile.

Representative examples of rare earth precursors include:

Y precursors: $Y(N(SiMe_3)_2)_3$, $Y(N(^iPr)_2)_3$, $Y(N(^tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(^iPr))_3$.

La precursors: $La(N(SiMe_3)_2)_3$, $La(N(^iPr)_2)_3$, $La(N(^tBu)SiMe_3)_3$, $La(TMPD)_3$, $((^iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(^iPr))_3$, $La(OEt)_3$, $La(acac)_3$, $La(((^tBu)_2N)_2CMe)_3$, $La(((^iPr)_2N)_2CMe)_3$, $La(((^iPr)_2N)_2CH)_3$, $La(((^tBu)_2N)_2C(tBu))_3$, $La(((^iPr)_2N)_2C(^tBu))_3$, and $La(FOD)_3$.

Ce precursors: $Ce(N(SiMe_3)_2)_3$, $Ce(N(^iPr)_2)_3$, $Ce(N(^tBu)SiMe_3)_3$, $Ce(TMPD)_3$, $Ce(FOD)_3$, $((^iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(^iPr))_3$, and $Ce(acac)_3$.

Pr precursors: $Pr(N(SiMe_3)_2)_3$, $((^iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(^iPr))_3$, $Pr(acac)_3$, $Pr(hfac)_3$, $Pr(((^tBu)_2N)_2CMe)_3$, $Pr(((^iPr)_2N)_2CMe)_3$, $Pr(((^tBu)_2N)_2C(^tBu))_3$, and $Pr(((^iPr)_2N)_2C(^tBu))_3$.

Nd precursors: $Nd(N(SiMe_3)_2)_3$, $Nd(N(^iPr)_2)_3$, $((^iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(^iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((^iPr)Cp)_3Sm$, $Cp_3Sm$, $Sm(THD)_3$, $Sm[OOCCH(C_2H_5)C_4H_9]_3$, $Sm(O(^iPr))_3$, $Sm(acac)_3$, and $(C_5Me_5)_2Sm$.

Eu precursors: $Eu(N(SiMe_3)_2)_3$, $((^iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(^iPr))_3$, $Eu(acac)_3$, and $(C_5Me_5)_2Eu$.

Gd precursors: $Gd(N(SiMe_3)_2)_3$, $((^iPr)Cp)_3Gd$, $Cp_3Gd$, $Gd(THD)_3$, $Gd[OOCCH(C_2H_5)C_4H_9]_3$, $Gd(O(^iPr))_3$, and $Gd(acac)_3$.

Tb precursors: $Tb(N(SiMe_3)_2)_3$, $((^iPr)Cp)_3Tb$, $Cp_3Tb$, $Tb(THD)_3$, $Tb[OOCCH(C_2H_5)C_4H_9]_3$, $Tb(O(^iPr))_3$, and $Tb(acac)_3$.

Dy precursors: $Dy(N(SiMe_3)_2)_3$, $((^iPr)Cp)_3Dy$, $Cp_3Dy$, $Dy(THD)_3$, $Dy[OOCCH(C_2H_5)C_4H_9]_3$, $Dy(O(^iPr))_3$, $Dy(O_2C(CH_2)_6CH_3)_3$, and $Dy(acac)_3$.

Ho precursors: $Ho(N(SiMe_3)_2)_3$, $((^iPr)Cp)_3Ho$, $Cp_3Ho$, $Ho(THD)_3$, $Ho[OOCCH(C_2H_5)C_4H_9]_3$, $Ho(O(^iPr))_3$, and $Ho(acac)_3$.

Er precursors: $Er(N(SiMe_3)_2)_3$, $((^iPr)Cp)_3Er$, $((nBu)Cp)_3Er$, $Cp_3Er$, $Er(THD)_3$, $Er[OOCCH(C_2H_5)C_4H_9]_3$, $Er(O(^iPr))_3$, and $Er(acac)_3$.

Tm precursors: $Tm(N(SiMe_3)_2)_3$, $((^iPr)Cp)_3Tm$, $Cp_3Tm$, $Tm(THD)_3$, $Tm[OOCCH(C_2H_5)C_4H_9]_3$, $Tm(O(^iPr))_3$, and $Tm(acac)_3$.

Yb precursors: $Yb(N(SiMe_3)_2)_3$, $Yb(N(^iPr)_2)_3$, $((^iPr)Cp)_3Yb$, $Cp_3Yb$, $Yb(THD)_3$, $Yb[OOCCH(C_2H_5)C_4H_9]_3$, $Yb(O(^iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((^iPr)Cp)_3Lu$, $Cp_3Lu$, $Lu(THD)_3$, $Lu[OOCCH(C_2H_5)C_4H_9]_3$, $Lu(O(^iPr))_3$, and $Lu(acac)_3$.

In the above precursors, as well as precursors set forth below, the following common abbreviations are used: Si: silicon; Me: methyl; Et: ethyl; $^iPr$: isopropyl; nPr: n-propyl; Bu: butyl; nBu: n-butyl; sBu: sec-butyl; $^iBu$: iso-butyl; $^tBu$:

tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 6A, the oxygen-containing gas supply system 46 is configured to introduce an oxygen-containing gas to the process chamber 10. The oxygen-containing gas can include, but is not limited to, $O_2$, water ($H_2O$), or peroxide ($H_2O_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). According to one embodiment of the invention, an oxygen- and nitrogen-containing gas may be utilized, for example, NO, $NO_2$, or $N_2O$, or a combination thereof, and optionally an inert gas such as Ar.

Embodiments of the invention may utilize a wide variety of silicon precursors for incorporating silicon into high-k films. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), tetra-ethyl orthosilicate (TEOS, $Si(OCH_2CH_3)_4$) and alkylaminosilane compounds. Examples of alkylaminosilane compounds include, but are not limited to, di-isopropylaminosilane ($H_3Si(NPr_2)$), bis(tert-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(di-isopropylamino)silane ($H_2Si(NPr_2)_2$), tris(isopropylamino)silane ($HSi(NPr_2)_3$), and (di-isopropylamino)silane ($H_3Si(NPr_2)$).

Still referring to FIG. 6A, the purge gas supply system 44 is configured to introduce a purge gas to process chamber 10. For example, the introduction of purge gas may occur between introduction of pulses of first and second precursors and an oxygen-containing gas, a nitrogen-containing gas, or an oxygen- and a nitrogen-containing gas to the process chamber 10. The purge gas can contain an inert gas, such as a noble gas (i.e., He, Ne, Ar, Kr, Xe), nitrogen ($N_2$), or hydrogen ($H_2$).

Furthermore, processing system 1 includes substrate temperature control system 60 coupled to the substrate holder 20 and configured to elevate and control the temperature of substrate 22. Substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to approximately 550° C. Alternatively, the substrate temperature can, for example, range from approximately 150° C. to approximately 350° C. It is to be understood, however, that the temperature of the substrate is selected based on the desired temperature for causing deposition of a particular dielectric material on the surface of a given substrate.

In order to improve the thermal transfer between substrate 22 and substrate holder 20, substrate holder 20 can include a mechanical clamping system, or an electrical clamping system, such as an electrostatic clamping system, to affix substrate 22 to an upper surface of substrate holder 20. Furthermore, substrate holder 20 can further include a substrate backside gas delivery system configured to introduce gas to the back-side of substrate 22 in order to improve the gas-gap thermal conductance between substrate 22 and substrate holder 20. Such a system can be utilized when temperature control of the substrate is required at elevated or reduced temperatures. For example, the substrate backside gas delivery system can contain a two-zone gas distribution system, wherein the helium gas gap pressure can be independently varied between the center and the edge of substrate 22.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 22, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the high-k materials.

The first precursor supply system 40, second precursor supply system 42, purge gas supply system 44, oxygen-containing gas supply system 46, the nitrogen-containing gas supply system 48, and auxiliary gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for precursor gases can be between 0.3 and 3 sec, for example 1 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 6A, controller 70 can contain a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, first precursor supply system 40, second precursor supply system 42, purge gas supply system 44, oxygen-containing gas supply system 46, nitrogen-containing gas supply system 48, auxiliary gas supply system 50, substrate temperature control system 60, and pressure control system 32. For example, a program stored in the memory may be utilized to activate the inputs to the aforementioned components of the processing system 1 according to a process recipe in order to perform a deposition process.

FIG. 6B illustrates a plasma processing system 2 that may be configured for performing PEALD or PECVD processing, in addition being able to perform ALD or CVD processing. The plasma processing system 2 is similar to the processing system 1 described in FIG. 6A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

In addition, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the plasma processing system 2 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 22. The substrate power source 54 may include a RF generator and an impedance match network, and may further include an electrode through which RF power is coupled to substrate 22. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 6B as separate entities, they may indeed contain one or more power sources coupled to substrate holder 20.

In addition, the plasma processing system 2 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 22. The remote plasma system 56 can, for example, contain a microwave frequency generator. The process chamber pressure can be between about 0.1 Torr and about 10 Torr, or between about 0.2 Torr and about 3 Torr.

A plurality of embodiments for forming gate dielectric stacks with a reduced effective oxide thickness have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a gate dielectric film stack, the method comprising:
   providing a silicon-containing substrate;
   forming an interface layer on the silicon-containing substrate, the interface layer having a first equivalent oxide thickness;
   depositing a first high-k film on the interface layer;
   heat-treating the first high-k film and the interface layer at a temperature that consumes the entire first high-k film to form a modified interface layer having a second equivalent oxide thickness that is equal to or lower than the first equivalent oxide thickness; and
   depositing a second high-k film directly on the modified interface layer.

2. The method of claim 1, wherein the interface layer comprises silicon oxide, silicon nitride, or silicon oxynitride.

3. The method of claim 1, wherein the first high-k film comprises an alkaline earth element, titanium, hafnium, zirconium, or a rare earth element, or any combination of two or more thereof.

4. The method of claim 1, wherein the second high-k film comprises an alkaline earth element, titanium, hafnium, or a rare earth element, or any combination of two or more thereof.

5. The method of claim 1, wherein the first high-k film comprises a rare earth-based oxide, nitride, or oxynitride containing yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combination of two or more thereof.

6. The method of claim 1, wherein the second high-k film comprises hafnium oxide, hafnium oxynitride, hafnium silicate, hafnium silicon oxynitride, zirconium oxide, zirconium oxynitride, zirconium silicate, zirconium silicon oxynitride, hafnium zirconium oxide, hafnium zirconium oxynitride, hafnium zirconium silicate, or hafnium zirconium silicon oxynitride, or a combination of two or more thereof.

7. The method of claim 1, wherein the heat-treating comprises:
heating the first high-k film and the interface layer at the temperature under substantially oxygen-free reduced pressure conditions.

8. The method of claim 7, wherein the heat-treating further comprises exposing the first high-k film to an inert gas.

9. The method of claim 1, further comprising:
nitriding at least a portion of a thickness of the second high-k film;
depositing a gate electrode film on the nitrided second high-k film; and
patterning the gate electrode film, the nitrided second high-k film, and the modified interface layer.

10. A method for forming a gate dielectric stack, the method comprising:
providing a silicon-containing substrate;
forming a silicon oxide interface layer on the silicon-containing substrate, the silicon oxide interface layer having a first equivalent oxide thickness;
depositing a rare earth oxide first high-k film on the silicon oxide interface layer;
heat-treating the rare earth oxide first high-k film and the silicon oxide interface layer to a temperature that consumes the entire rare earth oxide first high-k film to form a modified interface layer having a second equivalent oxide thickness that is equal to or lower than the first equivalent oxide thickness; and
depositing a hafnium-oxygen-based second high-k film directly on the modified interface layer.

11. The method of claim 10, wherein the rare earth oxide first high-k film comprises yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combination of two or more thereof.

12. The method of claim 10, wherein the hafnium-oxygen-based second high-k film comprises hafnium oxide, hafnium oxynitride, hafnium silicate, hafnium silicon oxynitride, hafnium zirconium oxide, hafnium zirconium oxynitride, hafnium zirconium silicate, or hafnium zirconium silicon oxynitride, or a combination of two or more thereof.

13. The method of claim 10, wherein the heat-treating comprises:
heating the rare earth oxide first high-k film and the silicon oxide interface layer at the temperature under substantially oxygen-free reduced pressure conditions.

14. The method of claim 13, wherein the heat-treating further comprises exposing the rare earth oxide first high-k film to an inert gas.

15. The method of claim 10, further comprising:
nitriding at least a portion of a thickness of the hafnium-oxygen-based second high-k film;
depositing a gate electrode film on the nitrided hafnium-oxygen-based second high-k film; and
patterning the gate electrode film, the nitrided hafnium-oxygen-based second high-k film, and the modified interface layer.

16. A method for forming a gate dielectric stack, the method comprising:
providing a silicon-containing substrate;
forming a silicon oxide interface layer on the silicon-containing substrate, the silicon oxide interface layer having a first equivalent oxide thickness;
depositing a lanthanum oxide first high-k film on the silicon oxide interface layer by an atomic layer deposition process;
heat-treating the lanthanum oxide first high-k film and the silicon oxide interface layer to a temperature equal to or greater than 900° C. that consumes the entire lanthanum oxide first high-k film to form a modified interface layer having a second equivalent oxide thickness that is equal to or lower than the first equivalent oxide thickness; and
depositing a second high-k film directly on the modified interface layer.

17. The method of claim 16, wherein the heat-treating is performed under substantially oxygen-free reduced pressure conditions.

18. The method of claim 16, wherein the heat-treating is performed under an inert atmosphere with less than 0.1% $O_2$.

19. The method of claim 16, wherein the second high-k film comprises hafnium oxide, hafnium oxynitride, hafnium silicate, hafnium silicon oxynitride, zirconium oxide, zirconium oxynitride, zirconium silicate, zirconium silicon oxynitride, hafnium zirconium oxide, hafnium zirconium oxynitride, hafnium zirconium silicate, or hafnium zirconium silicon oxynitride, or a combination of two or more thereof.

20. The method of claim 16, further comprising:
nitriding at least a portion of a thickness of the second high-k film;
depositing a titanium nitride gate electrode film on the nitrided second high-k film; and
patterning the titanium nitride gate electrode film, the nitrided second high-k film, and the modified interface layer.

* * * * *